US009853079B2

(12) United States Patent
Oganesian et al.

(10) Patent No.: US 9,853,079 B2
(45) Date of Patent: Dec. 26, 2017

(54) METHOD OF FORMING A STRESS RELEASED IMAGE SENSOR PACKAGE STRUCTURE

(71) Applicant: Optiz, Inc., Palo Alto, CA (US)

(72) Inventors: Vage Oganesian, Sunnyvale, CA (US); Zhenhua Lu, Jiangsu (CN)

(73) Assignee: Optiz, Inc., Palo Alto, CA (US)

( * ) Notice: Subject to any disclaimer, the term of this patent is extended or adjusted under 35 U.S.C. 154(b) by 0 days.

(21) Appl. No.: 15/369,603

(22) Filed: Dec. 5, 2016

(65) Prior Publication Data

US 2017/0084656 A1 Mar. 23, 2017

Related U.S. Application Data

(62) Division of application No. 15/017,506, filed on Feb. 5, 2016, now Pat. No. 9,543,347.

(60) Provisional application No. 62/120,255, filed on Feb. 24, 2015.

(51) Int. Cl.
*H01L 27/146* (2006.01)
*H01L 25/065* (2006.01)

(52) U.S. Cl.
CPC .... *H01L 27/14632* (2013.01); *H01L 25/0655* (2013.01); *H01L 27/14618* (2013.01); *H01L 27/14625* (2013.01); *H01L 27/14627* (2013.01); *H01L 27/14636* (2013.01); *H01L 27/14643* (2013.01); *H01L 27/14685* (2013.01); *H01L 27/14687* (2013.01); *H01L 27/14698* (2013.01); *H01L 2224/11* (2013.01)

(58) Field of Classification Search
CPC ......... H01L 27/14632; H01L 27/14636; H01L 27/14625; H01L 27/14627; H01L 27/14643; H01L 27/14685; H01L 27/14687

See application file for complete search history.

(56) References Cited

U.S. PATENT DOCUMENTS

| 6,166,784 A | 12/2000 | Murata et al. |
|---|---|---|
| 6,759,718 B2 | 7/2004 | Prior |
| 6,777,767 B2 | 8/2004 | Badehi |

(Continued)

FOREIGN PATENT DOCUMENTS

| JP | 2001127010 | 5/2001 |
|---|---|---|
| JP | 2009206253 | 9/2009 |

(Continued)

*Primary Examiner* — Thanhha Pham
(74) *Attorney, Agent, or Firm* — DLA Piper LLP US (57) ABSTRACT

A sensor package that includes a substrate with opposing first and second surfaces. A plurality of photo detectors are formed on or under the first surface and configured to generate one or more signals in response to light incident on the first surface. A plurality of contact pads are formed at the first surface and are electrically coupled to the plurality of photo detectors. A plurality of holes are each formed into the second surface and extending through the substrate to one of the contact pads. Conductive leads each extend from one of the contact pads, through one of the plurality of holes, and along the second surface. The conductive leads are insulated from the substrate. One or more trenches are formed into a periphery portion of the substrate each extending from the second surface to the first surface. Insulation material covers sidewalls of the one or more trenches.

14 Claims, 13 Drawing Sheets

(56) References Cited

U.S. PATENT DOCUMENTS

| | | |
|---|---|---|
| 6,972,480 B2 | 12/2005 | Zilber et al. |
| 7,033,664 B2 | 4/2006 | Zilber et al. |
| 7,157,742 B2 | 1/2007 | Badehi |
| 7,160,478 B2 | 1/2007 | Leib et al. |
| 7,192,796 B2 | 3/2007 | Zilber et al. |
| 7,265,440 B2 | 9/2007 | Zilber et al. |
| 7,495,341 B2 | 2/2009 | Zilber et al. |
| 7,573,547 B2 | 8/2009 | Palmateer et al. |
| 7,642,629 B2 | 1/2010 | Zilber et al. |
| 7,683,975 B2 | 3/2010 | Kageyama |
| 7,859,033 B2 | 12/2010 | Brady |
| 7,986,178 B2 | 7/2011 | Lynch |
| 8,432,011 B1 | 4/2013 | Oganesian |
| 8,455,969 B2 | 6/2013 | Nabe et al. |
| 8,546,900 B2 | 10/2013 | Oganesian |
| 8,546,951 B2 | 10/2013 | Oganesian |
| 8,552,518 B2 | 10/2013 | Oganesian |
| 8,570,669 B2 | 10/2013 | Oganesian |
| 8,604,576 B2 | 12/2013 | Oganesian |
| 8,637,949 B2 | 1/2014 | Uekawa |
| 8,692,344 B2 | 4/2014 | Oganesian |
| 8,759,930 B2 | 6/2014 | Oganesian |
| 8,796,800 B2 | 8/2014 | Oganesian |
| 8,860,152 B2 | 10/2014 | Cherian et al. |
| 8,890,268 B2 | 11/2014 | Huang et al. |
| 9,018,725 B2 | 4/2015 | Oganesian |
| 9,233,511 B2 | 1/2016 | Oganesian |
| 2004/0251525 A1 | 12/2004 | Zilber |
| 2005/0104179 A1 | 5/2005 | Zilber |
| 2005/0205977 A1 | 9/2005 | Zilber |
| 2005/0225877 A1 | 10/2005 | Tang |
| 2007/0138498 A1 | 6/2007 | Zilber |
| 2007/0190691 A1 | 8/2007 | Humpston |
| 2007/0190747 A1 | 8/2007 | Humpston |
| 2007/0268417 A1 | 11/2007 | Kato et al. |
| 2007/0279365 A1 | 12/2007 | Kageyama |
| 2007/0279539 A1 | 12/2007 | Suzuki et al. |
| 2008/0012115 A1 | 1/2008 | Zilber |
| 2008/0017879 A1 | 1/2008 | Zilber |
| 2008/0083976 A1 | 4/2008 | Haba |
| 2008/0083977 A1 | 4/2008 | Haba |
| 2008/0088756 A1 | 4/2008 | Tseng et al. |
| 2008/0099900 A1 | 5/2008 | Oganesian |
| 2008/0099907 A1 | 5/2008 | Oganesian |
| 2008/0116544 A1 | 5/2008 | Grinman |
| 2008/0116545 A1 | 5/2008 | Grinman |
| 2008/0150121 A1 | 6/2008 | Oganesian |
| 2008/0225404 A1 | 9/2008 | Tang |
| 2008/0239136 A1 | 10/2008 | Kanai et al. |
| 2008/0246136 A1 | 10/2008 | Haba et al. |
| 2009/0021823 A1 | 1/2009 | Heim et al. |
| 2009/0115047 A1 | 5/2009 | Haba |
| 2009/0128922 A1 | 5/2009 | Justis et al. |
| 2009/0160065 A1 | 6/2009 | Haba |
| 2009/0212381 A1 | 8/2009 | Crisp |
| 2010/0053407 A1 | 3/2010 | Crisp |
| 2010/0225006 A1 | 9/2010 | Haba |
| 2010/0230812 A1 | 9/2010 | Oganesian |
| 2010/0237452 A1 | 9/2010 | Hagiwara et al. |
| 2011/0012259 A1 | 1/2011 | Grinman |
| 2011/0031629 A1 | 2/2011 | Haba |
| 2011/0033979 A1 | 2/2011 | Haba |
| 2011/0049696 A1 | 3/2011 | Haba |
| 2011/0187007 A1 | 8/2011 | Haba |
| 2011/0317371 A1 | 12/2011 | Liu |
| 2012/0018863 A1 | 1/2012 | Oganesian |
| 2012/0018868 A1 | 1/2012 | Oganesian |
| 2012/0018893 A1 | 1/2012 | Oganesian |
| 2012/0018894 A1 | 1/2012 | Oganesian |
| 2012/0018895 A1 | 1/2012 | Oganesian |
| 2012/0020026 A1 | 1/2012 | Oganesian |
| 2012/0068327 A1 | 3/2012 | Oganesian |
| 2012/0068330 A1 | 3/2012 | Oganesian |
| 2012/0068351 A1 | 3/2012 | Oganesian |
| 2012/0068352 A1 | 3/2012 | Oganesian |
| 2013/0168791 A1 | 7/2013 | Oganesian |
| 2013/0249031 A1 | 9/2013 | Oganesian |
| 2013/0337633 A1 | 12/2013 | Seddon |
| 2014/0264693 A1* | 9/2014 | Oganesian ............ H01L 24/95 257/432 |

FOREIGN PATENT DOCUMENTS

| | | |
|---|---|---|
| JP | 2009267049 | 11/2009 |
| JP | 2009290033 A | 12/2009 |
| TW | 200625660 A | 7/2006 |
| TW | 200834840 A | 8/2008 |
| TW | 201117346 A | 5/2011 |
| TW | 201123373 | 7/2011 |
| TW | 201129860 A | 9/2011 |
| TW | 201219978 A | 5/2012 |

* cited by examiner

METHOD OF FORMING A STRESS RELEASED IMAGE SENSOR PACKAGE STRUCTURE

RELATED APPLICATIONS

This application is a divisional of U.S. application Ser. No. 15/017,506, filed Feb. 5, 2016, which claims the benefit of U.S. Provisional Application No. 62/120,255 filed Feb. 24, 2015.

FIELD OF THE INVENTION

The present invention relates to image sensors, and more particularly to an image sensor that is packaged in a manner that reduces induced stress.

BACKGROUND OF THE INVENTION

Silicon wafers are hard, brittle and stable. However, a silicon wafer is only stable before it is processed to form integrated circuits thereon (e.g. doping, processing, thinning, having layers of material/structure added to it, etc.). After that, the wafer will become unstable, can warp severely especially when the wafer is very thin and has unbalanced structural support, making the wafer extremely frail and susceptible to mechanical stress damage.

As the wafer diameter gets larger to enhance productivity/efficiency and chips get thinner to meet the requirements for heat dissipation, die stacking, reduced electrical resistance and low profile devices, such thin chips on large wafers will suffer ever-greater magnitude of stresses than ever before. These mechanical stress issues are especially severe for image sensor wafers (i.e. wafer on which image sensors are formed). The active side of an image sensor wafer has layers of material and structures formed thereon, which can include passivation, low-k dielectric layers, microlenses, color filters, conductive circuits, optical enhancements, light shielding, etc. These layers and structures not only make the silicon wafer unstable, they themselves are even more susceptible to the same mechanical stress and can become damaged.

Additionally, the active side of an image sensor wafer can be encapsulated with a protective substrate, which includes stand offs (dam) structures to space it from the wafer. The stand offs are bonded to the surface layer and introduce mechanical stress to the surface layer, together with the buildup of enormous amounts of mechanical stress during wafer thinning and dicing steps, which can cause cracking, delamination and many other defects on the surface layers and/or silicon substrate.

It is known in the art to make a pre-cut (partial dicing) to avert/release mechanical stress build up. Processing such as Dice Before Grinding (DBG) includes making a partial cut into the silicon wafer, thinning the other side of the wafer, using plasma etch to relieve stress build up in the wafer, and then making the final singulation cut. However, a limitation of DBG processing or similar processing is that such processing is for non-packaged semiconductor silicon wafers. What is needed is a method and structure for mechanical stresses relief that is compatible with and is part of the Wafer Level Packaging (WLP) process (i.e. packaging of the integrated circuits before wafer singulation).

BRIEF SUMMARY OF THE INVENTION

The aforementioned problems and needs are addressed by a method of forming a sensor package includes providing a sensor chip that includes a first substrate with opposing first and second surfaces, a plurality of photo detectors formed on or under the first surface of the first substrate and configured to generate one or more signals in response to light incident on the first surface of the first substrate, and a plurality of contact pads formed at the first surface of the first substrate and which are electrically coupled to the plurality of photo detectors. A plurality of holes are formed into the second surface of the first substrate, wherein each of the plurality of holes extends through the first substrate and to one of the contact pads. A plurality of conductive leads are formed each extending from one of the contact pads, through one of the plurality of holes, and along the second surface of the first substrate. One or more trenches are formed into a periphery portion of the first substrate each extending from the second surface to the first surface. Insulation material is formed that covers sidewalls of the one or more trenches.

A method of forming a plurality of sensor packages includes providing a sensor chip that includes a first substrate with opposing first and second surfaces, and a plurality of sensors formed thereon, wherein each sensor includes a plurality of photo detectors formed on or under the first surface of the first substrate and configured to generate one or more signals in response to light incident on the first surface of the first substrate, and a plurality of contact pads formed at the first surface of the first substrate and which are electrically coupled to the plurality of photo detectors. A plurality of holes are formed into the second surface of the first substrate, wherein each of the plurality of holes extends through the first substrate and to one of the contact pads. A plurality of conductive leads are formed each extending from one of the contact pads, through one of the plurality of holes, and along the second surface of the first substrate. A dam structure is formed on the first surface of the first substrate and around but not over the plurality of photo detectors. A second substrate is formed on the dam structure, wherein the second substrate extends over the plurality of photo detectors, and wherein the dam structure and the second substrate form a sealed cavity over the plurality of photo detectors for each of the sensors. One or more trenches are formed into the first substrate at a periphery portion of each of the sensors extending from the second surface, to the first surface, and into the dam structure. Insulation material is formed that covers sidewalls of the one or more trenches. The first substrate is singulated into separate die at the trenches, wherein each die includes one of the sensors.

Other objects and features of the present invention will become apparent by a review of the specification, claims and appended figures.

DETAILED DESCRIPTION OF THE INVENTION

The present invention is a sensor package with steeping features on the sides of the package. The steeping feature is the result of making a pre-cut from the backside of the sensor wafer (e.g., image senor, light sensor, biometric sensor, etc.) instead of from the front side (active side). The steeping feature is encapsulated by a layer of encapsulant so that no silicon and/or passivation layers are exposed to the external elements. The bond pads of the image sensor are rerouted to the backside of the image sensor where interconnect bumps are formed. The front side of the image sensor is encapsulated by a permanent protective substrate using a dam structure that forms a cavity over the sensor active area.

Figure 1:
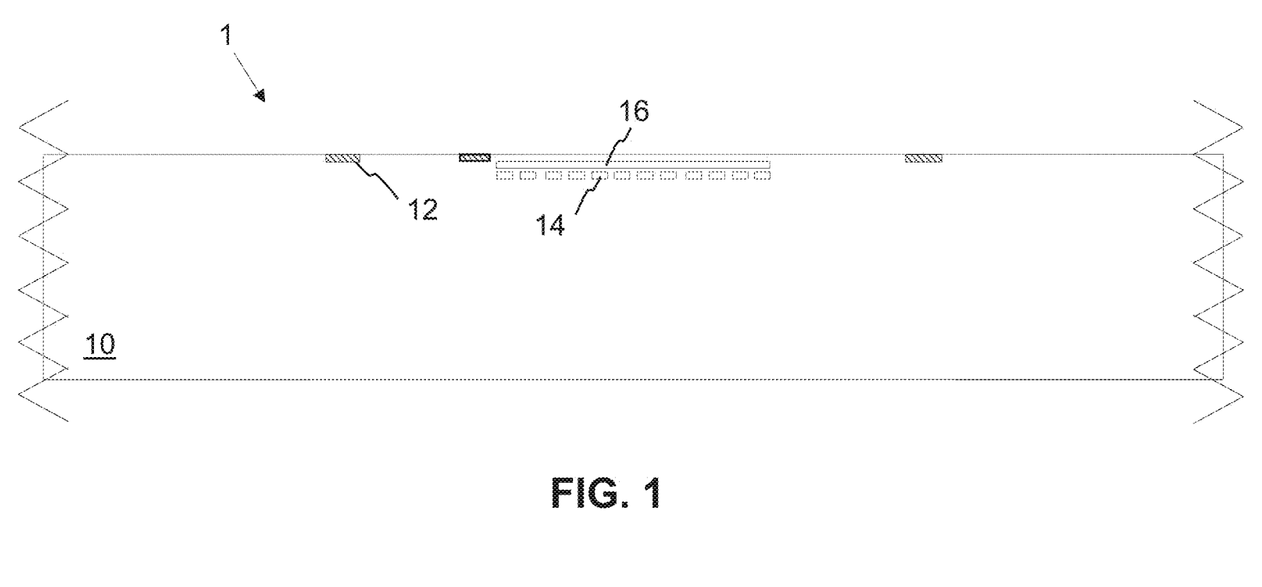
FIGS. 1-5 are side cross sectional views illustrating the steps in forming the image sensor package of the present invention.

FIGS. 1-14 illustrate the process of forming the image sensor assembly. The process begins by providing an image sensor wafer 1 having a semiconductor substrate 10, a plurality of bond pads 12 and active areas with photo detectors (i.e. photodiodes) 14 and circuit layers 16 that support the operation of the photodiodes 14, as illustrated in FIG. 1. The photodiodes 14 generate electrical signals in response to light incident on the sensor active area. Those signals are eventually coupled to the bond pads 12 for off chip signaling.

Figure 2:
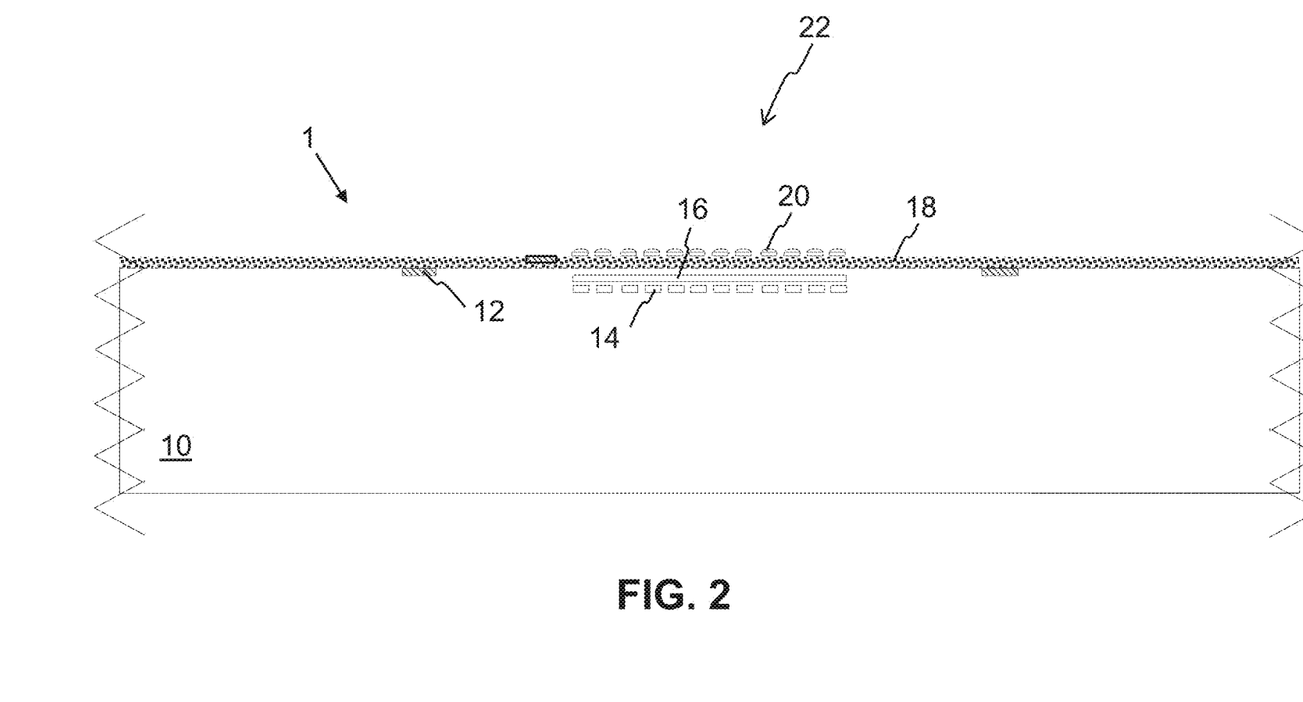

The image sensor 1 preferably includes a surface layer 18 that can include passivation, a low-k dielectric layer, microlenses and color filters 20, conductive circuits, optical enhancements, light shielding, etc. The image sensor wafer containing many image sensors 22 (each with its own photodiodes, circuit layers, bond pads, and surface layer) as shown in FIG. 2 is well known in the art, and not further described herein.

Figure 3:
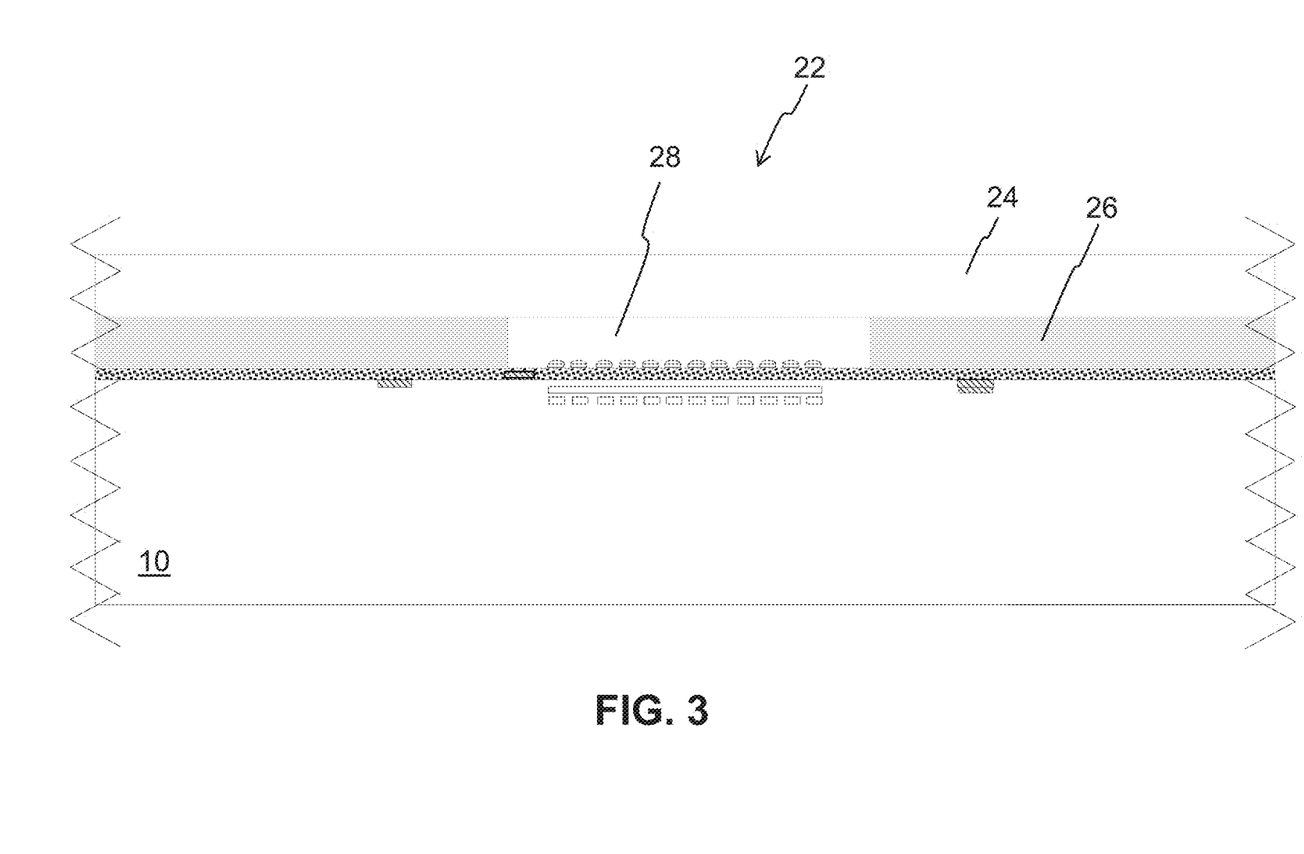
Figure 4:
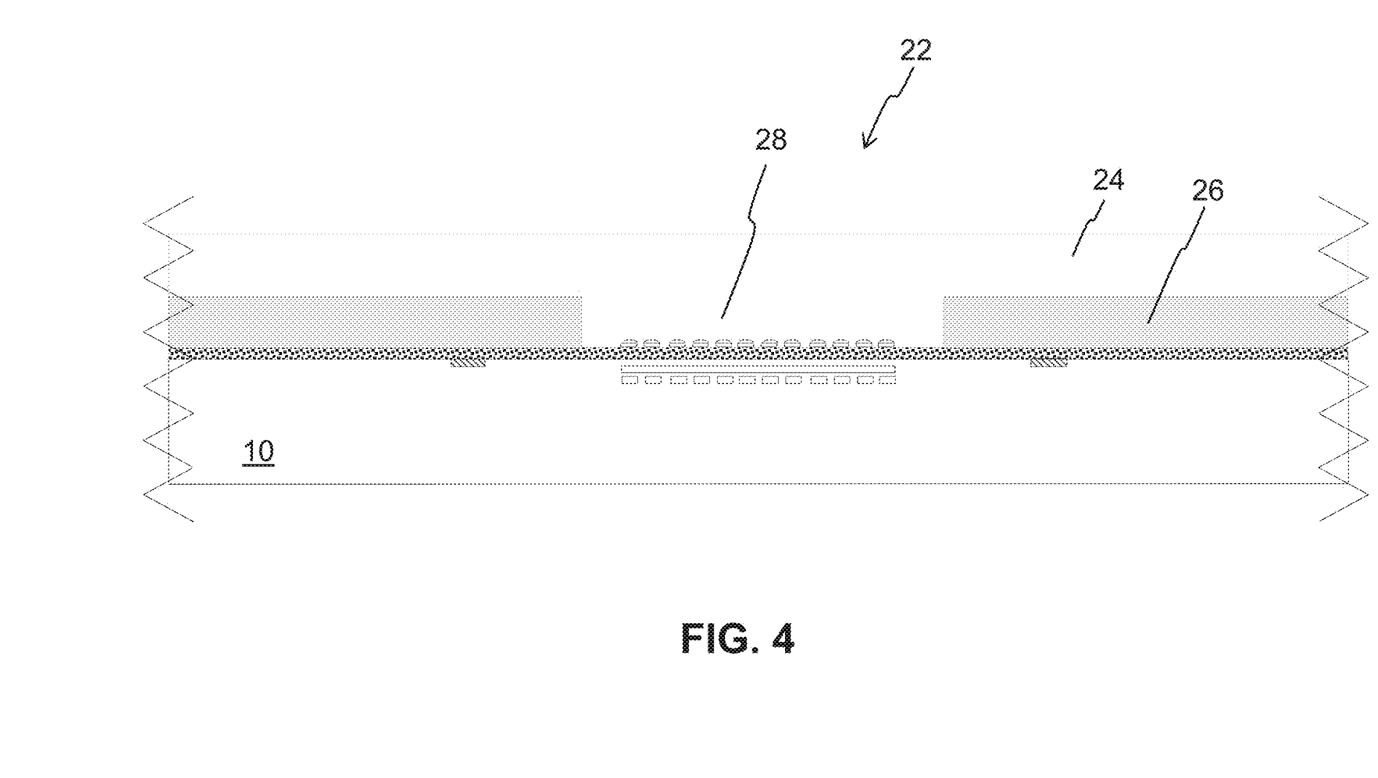

The sensor active area is encapsulated by a permanent protective substrate 24 mounted to the substrate by a dam structure 26. The protective substrate 24 is preferably optically transparent. The dam 26 is preferably formed on the optically transparent material by deposition of polymer material and selective removal of the polymer material. Adhesive is applied to the dam 26, which is then bonded to the image sensor wafer. The dam 26 and substrate 24 form a sealed cavity 28 over the active area of the image sensor 22, as shown in FIG. 3. The silicon on the back of the image sensor wafer substrate 10 can be thinned by mechanical grinding, chemical mechanical polishing (CMP), wet etching, atmospheric downstream plasma (ADP), dry chemical etching (DEC) or any other appropriate silicon thinning methods, as shown in FIG. 4. After the thinning process, an optional plasma-etching step can be made to release stress buildup in the wafer (however this will not release all the stress that has built up on the surface layer 18).

Figure 5:
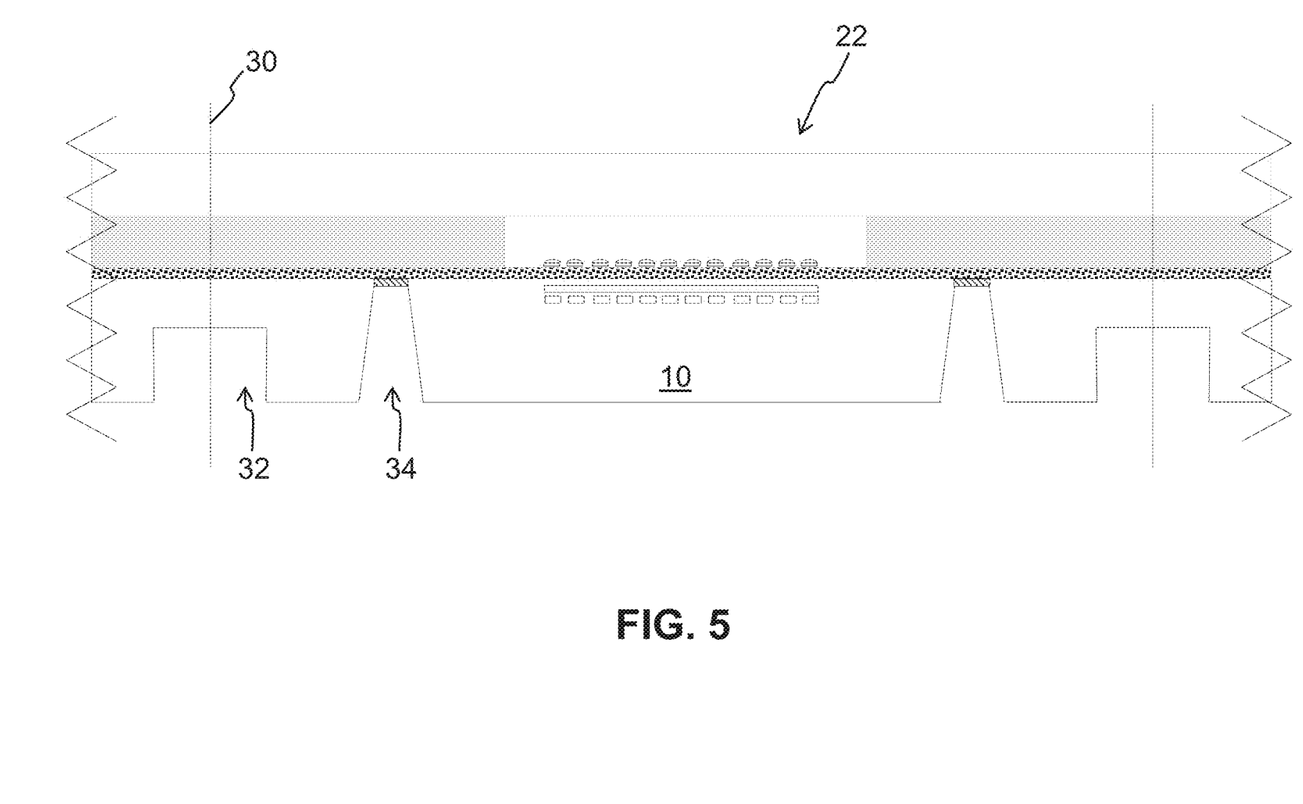
Figure 6A:
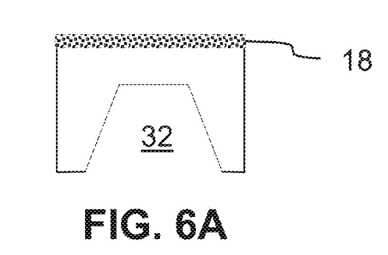
FIGS. 6A-6F are side cross sectional view illustrating alternate configurations of the trenches formed into the silicon substrate.
Figure 6B:
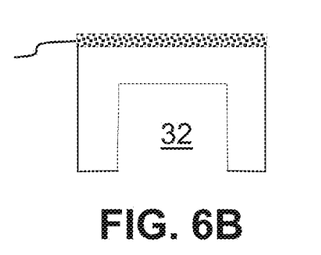
Figure 6C:
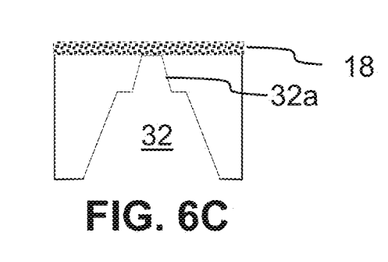
Figure 6D:
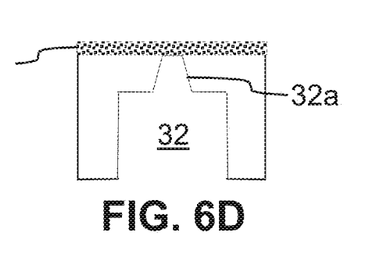
Figure 6E:
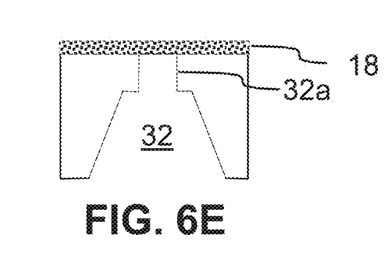
Figure 6F:
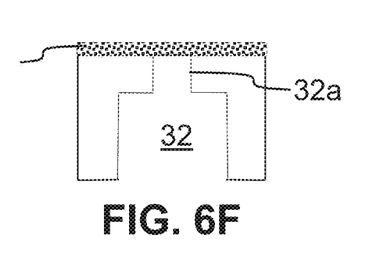
Figure 7A:
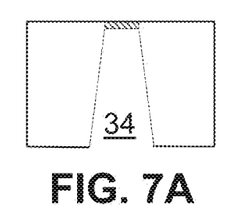
FIGS. 7A-7B are side cross sectional view illustrating alternate configurations of the via holes into the silicon substrate.
Figure 7B:
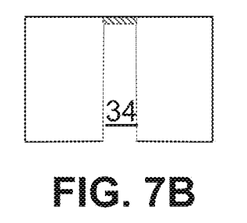

Portions of the silicon on the backside of the image sensor wafer substrate 10 are selectively removed at a scribe line 30 separating the image sensors 22 (forming trenches 32 that extend at least partially through substrate 10 and via holes 34 that extend through the substrate 10 to expose bond pads 12), as shown in FIG. 5. The silicon is selectively removed using lithography and plasma etching methods or any other silicon etching methods that are well known in the art. The image sensor bond pads 12 should be exposed from the backside of the image sensor wafer by the via holes 34, each of which extends all the way from the wafer back surface to one of the bond pads 12. The via holes 34 can be tapered or not tapered. The trenches 32 can be tapered or not, and can have optional secondary trench portions 32a that are tapered or not tapered, and can extend partially or completely through the wafer substrate 10, as shown in various configurations in FIGS. 6A-6F. Specifically, FIGS. 6A and 6B illustrate tapered and non-tapered trenches 32, respectively, etched partially through the silicon wafer which do not extend all the way to and expose the surface layer 18. FIGS. 6C-6F illustrate different variations of trench taper, each of which includes a trench 32 partially through the wafer, and a secondary trench portion 32a of trench 32 that extends all the way to and exposing the surface layer 18. In all the configurations of FIGS. 6C-6F, the trench 32 has a step (i.e., shoulder) in its silicon sidewall where trench portion 32a begins. FIGS. 7A and 7B show tapered and non-tapered via hole configurations, respectively.

Figure 8:
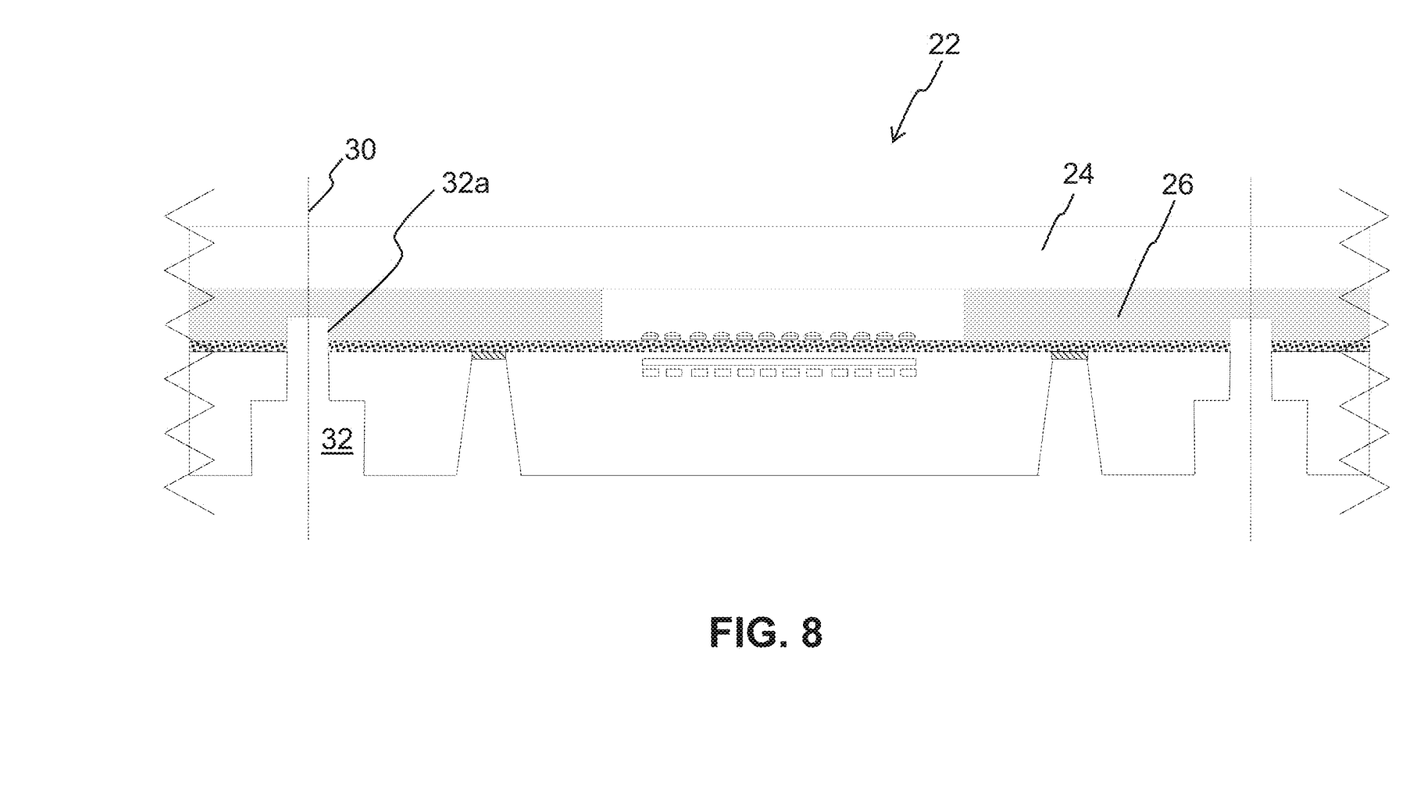
FIGS. 8-14 are side cross sectional views illustrating the steps in forming the image sensor package of the present invention.
Figure 9:
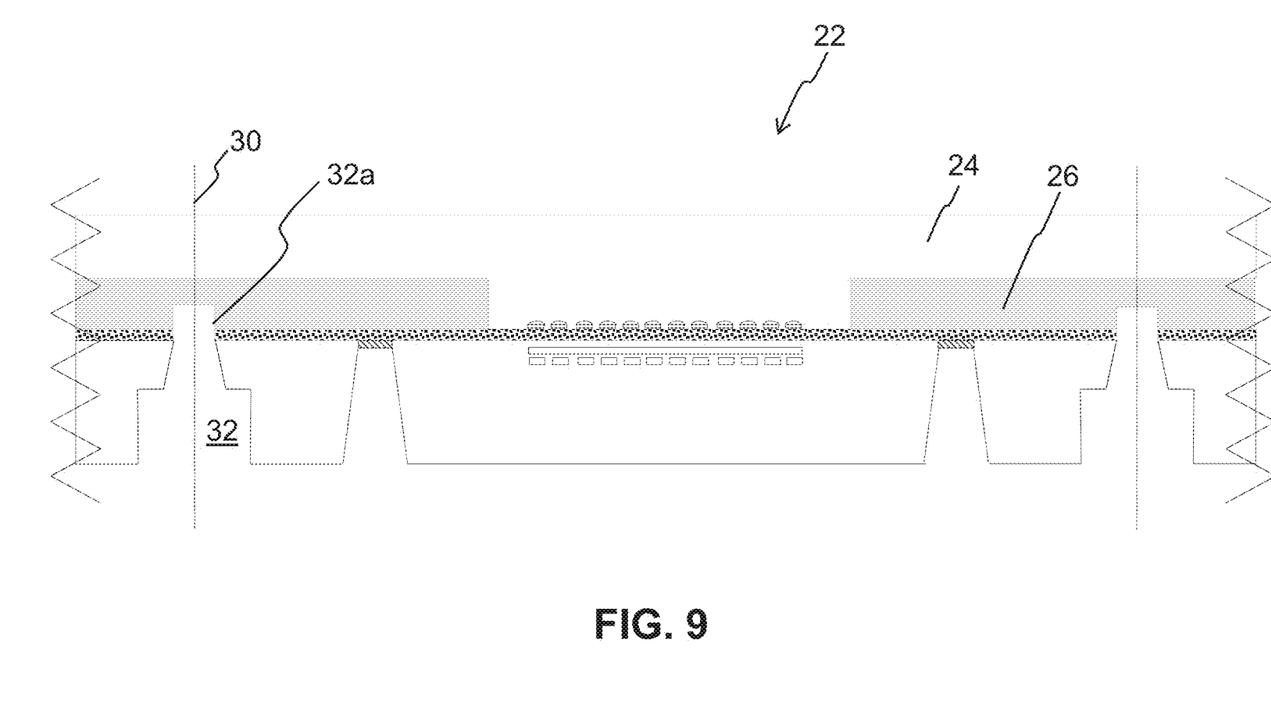

A mechanical dicer or laser is used to extend the trenches 32/32a through the surface layer(s) 18 and partially into the dam 26 (i.e. extending the trenches entirely through the silicon wafer and surface layer(s) and partially into the dam along the scribe line 30), as shown in FIG. 8. This will relieve the physical stress on the surface layer(s) and prevent it from cracking during the die singulation step later in the processing. FIG. 9 shows the same configuration except that the secondary trench portion 32a through the substrate 10 is tapered.

Figure 10:
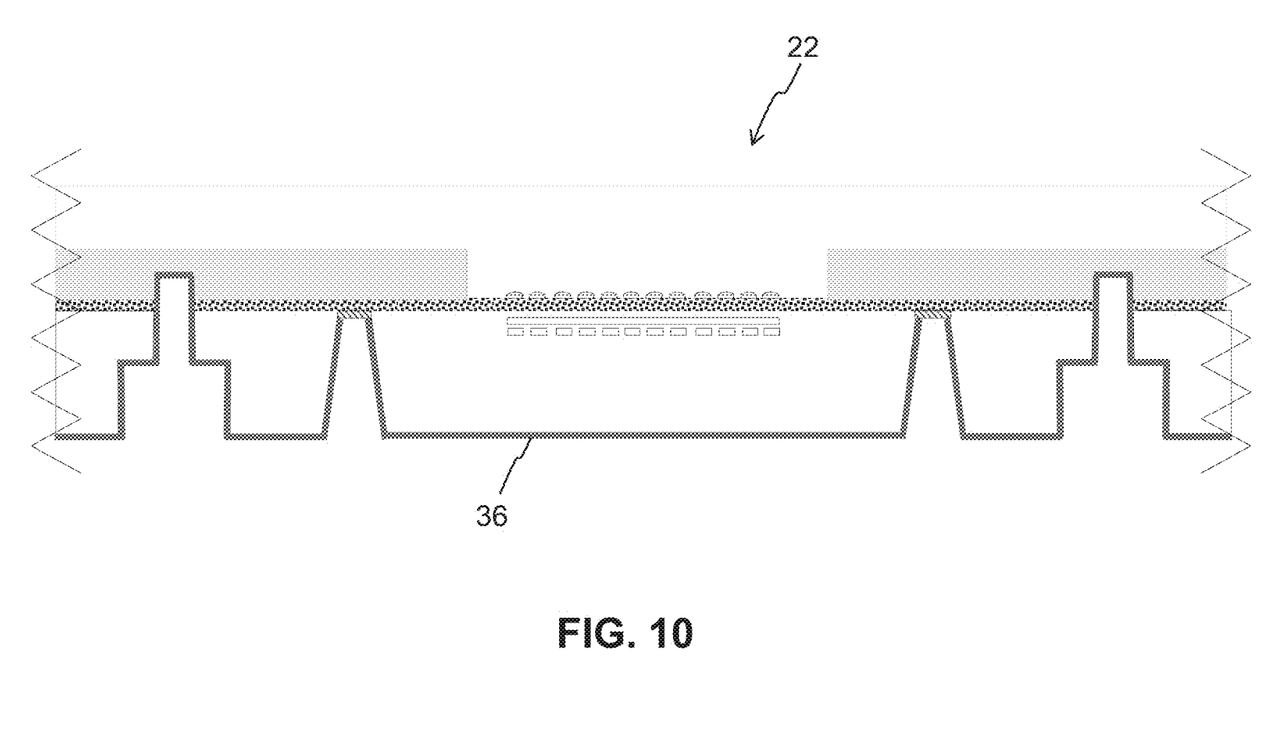

A layer of silicon dioxide, silicon nitride or any other appropriate passivation/isolation layer 36 can be conformably deposited over the backside of the silicon wafer using methods such as physical vapor deposition (PVD) or by spin/spray coating system. The passivation/isolation layer 36 is formed or selectively etched so that it lines trenches 32 and holes 34 except that the bond pads 18 are left exposed at the ends of the via holes 34, as shown in FIG. 10.

Figure 11:
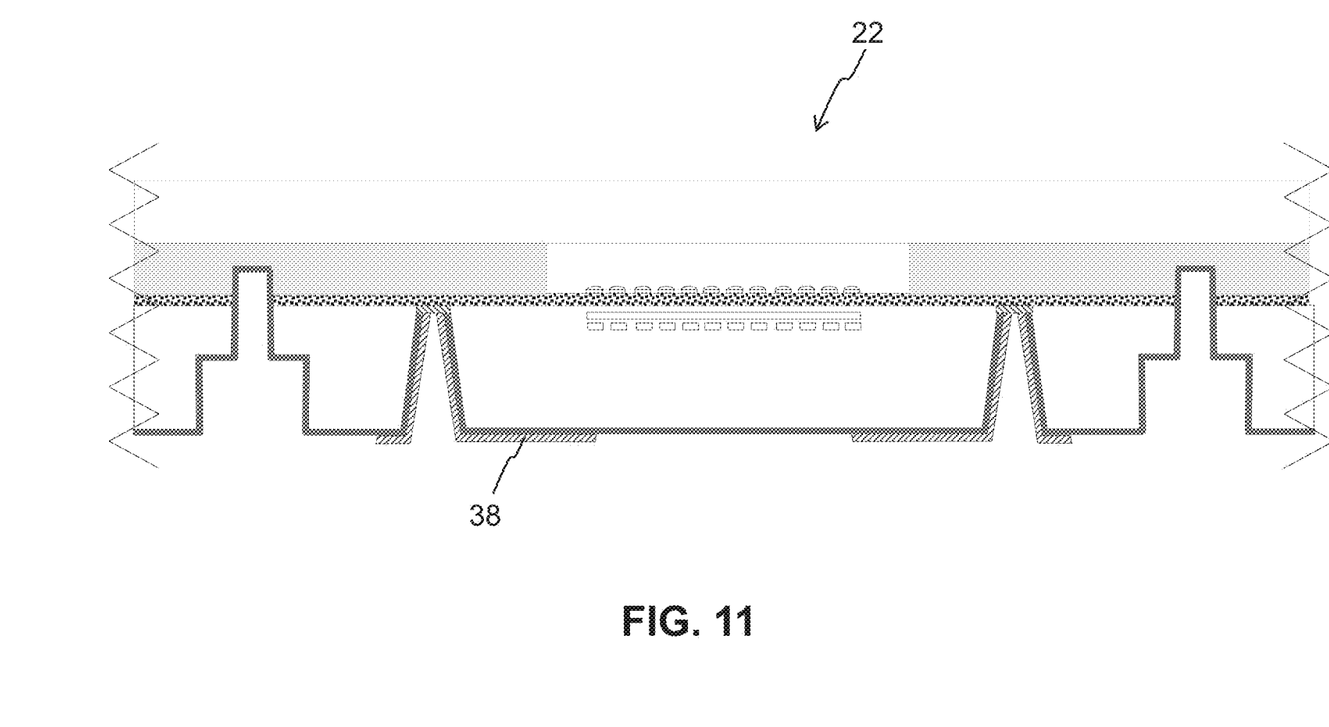

Conductive material is deposited over the passivation layer 36 using physical vapor deposition and plating or any other appropriate conductive layer deposition methods. The conductive layer can be a stack of titanium, copper, nickel and gold or any other appropriate conductive material. The conductive layer is selectively removed using photolithography and etching processes, leaving conductive leads 38 of the conductive material that each extend from one of the bond pads 12, along the via hole sidewall, and along the backside surface of the substrate 10, so as to electrically reroute the bond pad 12 to the backside of the image sensor through the via hole 34, as shown in FIG. 11.

Figure 12:
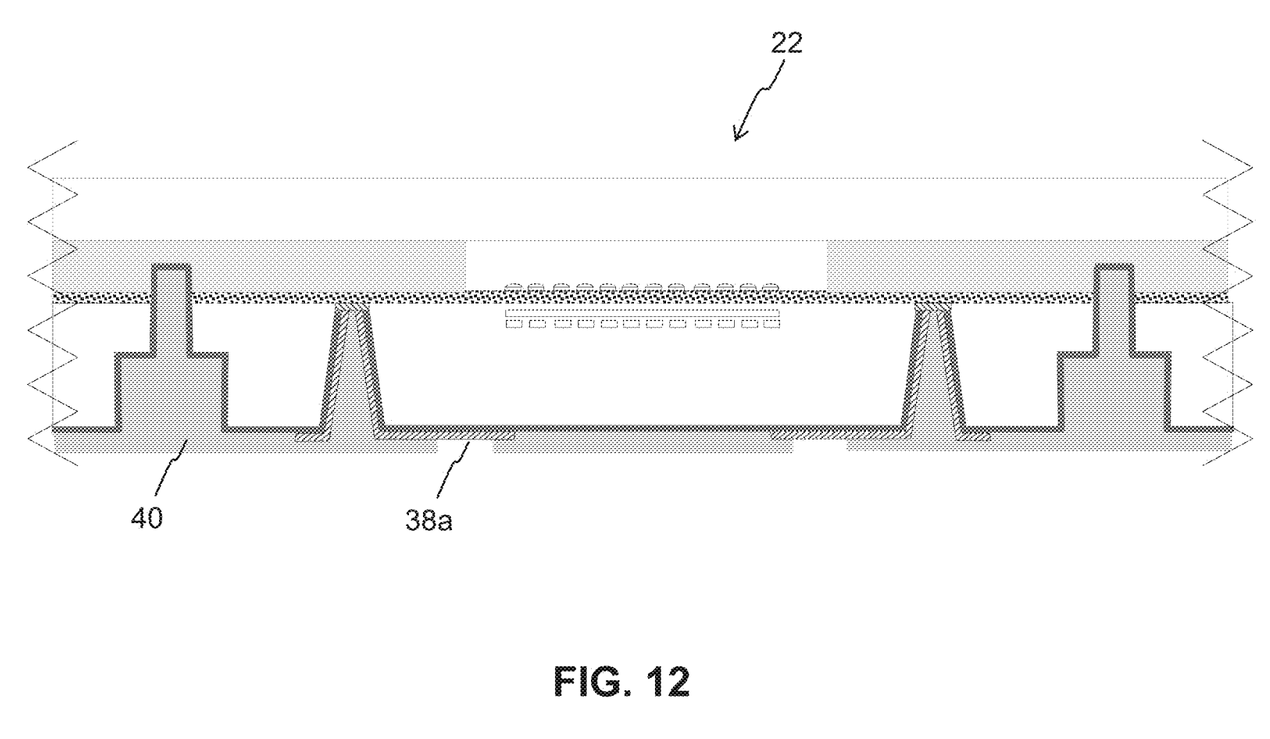

Encapsulant 40 is deposited over the backside of the substrate 10 covering the wafer backside and filling trenches 32 and holes 34. The encapsulant can be a polymer or other dielectric material. The encapsulant is selectively removed using a photolithography process to expose selective portions 38a of the conductive leads 38 (referred to as rerouted contact pads), as shown in FIG. 12. While the encapsulant is shown as completely filling all the backside trenches/holes, the encapsulant could instead be a thin conformal layer over the backside structures which does not completely fill the trenches/holes. The encapsulant can be deposited by spray coating.

Electrical interconnects 42 are formed on the rerouted contact pads 38a. Electrical interconnects 42 can be ball grid array (BGA), plated bump, conductive adhesive bump, gold stud bump or any other appropriate interconnection methods. Preferably, the interconnect bumps are solder ball grid array. Wafer level dicing/singulation of components through the scribe lines that run through trenches 32 is then done using mechanical blade dicing equipment or any other appropriate processes, which extends through the encapsulation 40, part of the dam 26 and the transparent substrate 24.

Figure 13:
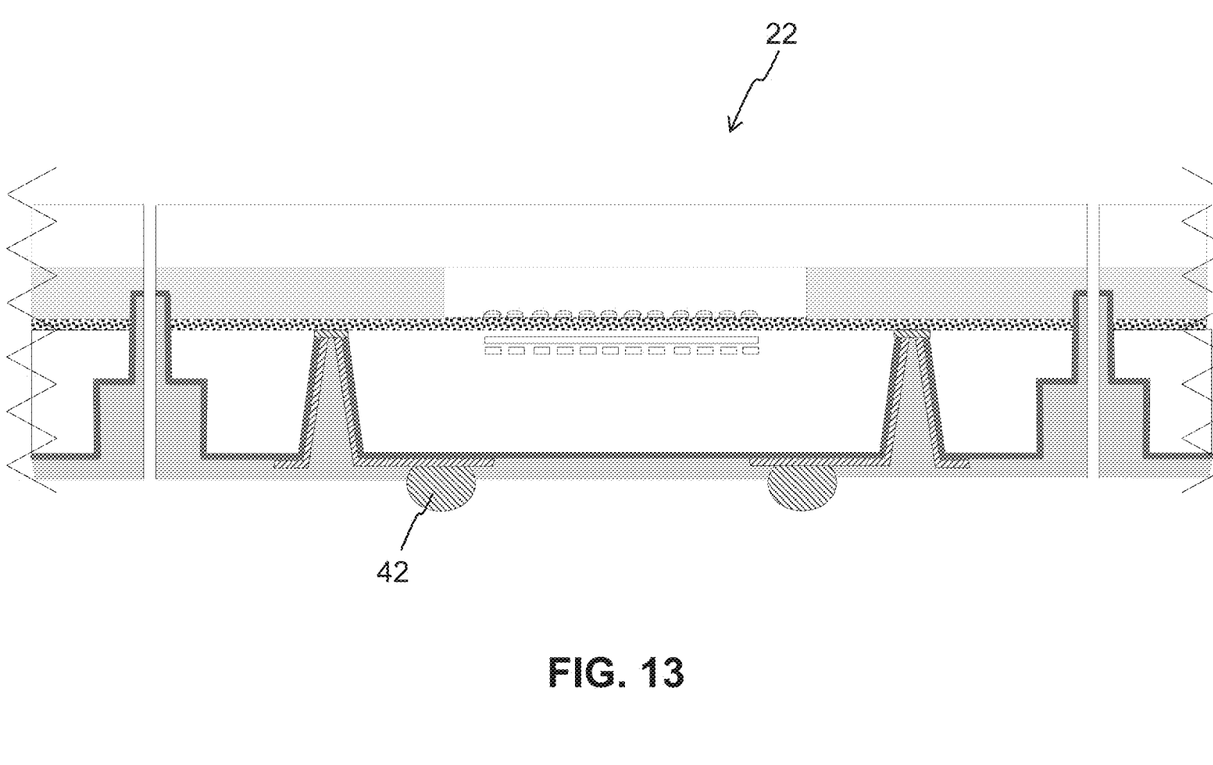

This singulation involves no cutting through the silicon substrate, and only partially through the dam 26, as shown in FIG. 13.

Figure 14:
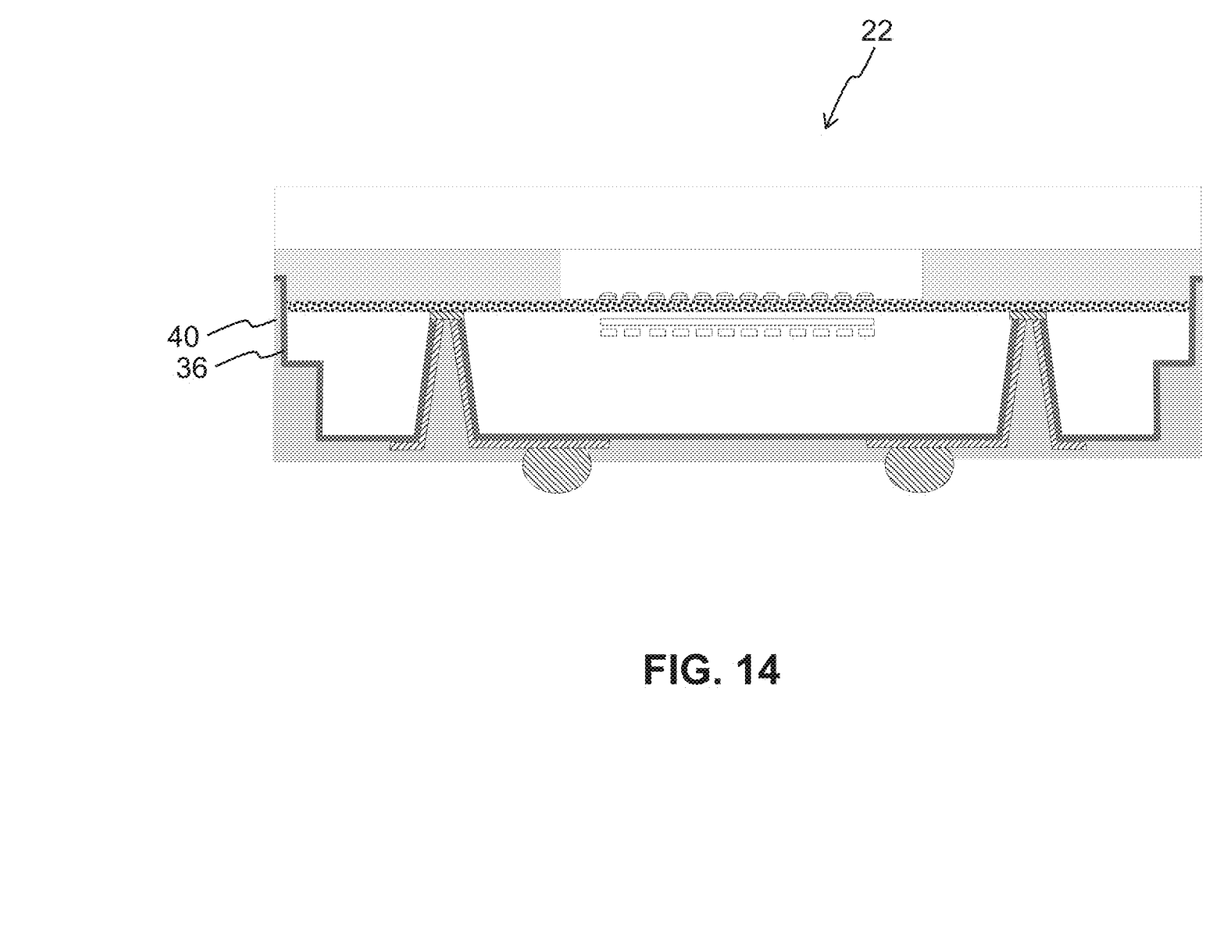

The final singulated die sensor package is shown in FIG. 14. The sides of the sensor die are encapsulated so that there is no exposed silicon of substrate 10 (i.e. the side portions of substrate 10 are protected/sealed by insulation layer 36 and encapsulation 40). Further, the sensor active area is never exposed once the dam 26 and transparent substrate 24 are formed thereon early in the process.

It is to be understood that the present invention is not necessary limited to the embodiment(s) described above and illustrated herein, but encompasses any and all variations falling within the scope of the claims. For example, the dam structure can be omitted, whereby the cavity is formed into the bottom surface of the protective substrate by etching of the substrate material. References to the present invention herein are not intended to limit the scope of any claim or claim term, but instead merely make reference to one or more features that may be covered by one or more claims. Materials, processes and numerical examples described above are exemplary only, and should not be deemed to limit any eventual claims. Further, not all method steps need be performed in the exact order illustrated, but rather in any order that allows the proper formation of the packaged image sensor. Lastly, single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A method of forming a sensor package, comprising:
   providing a sensor chip that includes a first substrate with opposing first and second surfaces, a plurality of photo detectors formed on or under the first surface of the first substrate and configured to generate one or more signals in response to light incident on the first surface of the first substrate, and a plurality of contact pads formed at the first surface of the first substrate and which are electrically coupled to the plurality of photo detectors;
   forming a plurality of holes into the second surface of the first substrate, wherein each of the plurality of holes extends through the first substrate and to one of the contact pads;
   forming a plurality of conductive leads each extending from one of the contact pads, through one of the plurality of holes, and along the second surface of the first substrate;
   forming one or more trenches into a periphery portion of the first substrate each extending from the second surface to the first surface; and
   forming insulation material that covers sidewalls of the one or more trenches.

2. The method of claim 1, further comprising:
   forming a dam structure on the first surface of the first substrate and around but not over the plurality of photo detectors;
   mounting a second substrate on the dam structure, wherein the second substrate extends over the plurality of photo detectors, and wherein the dam structure and the second substrate form a sealed cavity over the plurality of photo detectors.

3. The method of claim 1, further comprising:
   mounting a second substrate on the first surface, wherein the second substrate extends over the plurality of photo detectors, and wherein a cavity formed into a surface of the second substrate is positioned over and seals the plurality of photo detectors.

4. The method of claim 1, further comprising:
   forming a plurality of electrical connectors each electrically connected to one of the conductive leads.

5. The method of claim 4, further comprising:
   forming a layer of insulation material over the second surface of the first substrate and covering the conductive leads except for contact pad portions thereof which are in electrical contact with the plurality of electrical connectors.

6. The method of claim 1, further comprising:
   forming a layer of insulation material between each of the conductive leads and the first substrate.

7. The method of claim 1, wherein each of the plurality of holes has a funnel shaped cross section.

8. The method of claim 1, wherein the sidewalls of the one or more trenches include a shoulder formed therein.

9. A method of forming a plurality of sensor packages, comprising:
   providing a sensor chip that includes a first substrate with opposing first and second surfaces, and a plurality of sensors formed thereon, wherein each sensor includes a plurality of photo detectors formed on or under the first surface of the first substrate and configured to generate one or more signals in response to light incident on the first surface of the first substrate, and a plurality of contact pads formed at the first surface of the first substrate and which are electrically coupled to the plurality of photo detectors;
   forming a plurality of holes into the second surface of the first substrate, wherein each of the plurality of holes extends through the first substrate and to one of the contact pads;
   forming a plurality of conductive leads each extending from one of the contact pads, through one of the plurality of holes, and along the second surface of the first substrate;
   forming a dam structure on the first surface of the first substrate and around but not over the plurality of photo detectors;
   mounting a second substrate on the dam structure, wherein the second substrate extends over the plurality of photo detectors, and wherein the dam structure and the second substrate form a sealed cavity over the plurality of photo detectors for each of the sensors;

forming one or more trenches into the first substrate at a periphery portion of each of the sensors extending from the second surface, to the first surface, and into the dam structure; and forming insulation material that covers sidewalls of the one or more trenches; and singulating the first substrate into separate die at the trenches, wherein each die includes one of the sensors.

10. The method of claim 9, further comprising before the singulation:

forming a plurality of electrical connectors each electrically connected to one of the conductive leads.

11. The method of claim 10, further comprising before the singulation:

forming a layer of insulation material over the second surface of the first substrate and covering the conductive leads except for contact pad portions thereof which are in electrical contact with the plurality of electrical connectors.

12. The method of claim 9, further comprising before the singulation:

forming a layer of insulation material between each of the conductive leads and the first substrate.

13. The method of claim 9, wherein each of the plurality of holes has a funnel shaped cross section.

14. The method of claim 9, wherein the sidewalls of the one or more trenches include a shoulder formed therein.

* * * * *